(12) United States Patent
Nakata (10) Patent No.: US 11,251,098 B2
(45) Date of Patent: Feb. 15, 2022

(54) SEMICONDUCTOR DEVICE, PRODUCTION METHOD THEREFOR, AND AUTOMOBILE

(71) Applicant: Mitsubishi Electric Corporation, Tokyo (JP)

(72) Inventor: Yosuke Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/647,420

(22) PCT Filed: Nov. 1, 2017

(86) PCT No.: PCT/JP2017/039517
§ 371 (c)(1),
(2) Date: Mar. 13, 2020

(87) PCT Pub. No.: WO2019/087327
PCT Pub. Date: May 9, 2019

(65) Prior Publication Data
US 2020/0266117 A1    Aug. 20, 2020

(51) Int. Cl.
| H01L 23/043 | (2006.01) |
| H01L 23/057 | (2006.01) |
| H01L 23/24 | (2006.01) |
| H01L 23/498 | (2006.01) |
| H01L 23/373 | (2006.01) |
| H01L 23/66 | (2006.01) |
| H01L 25/07 | (2006.01) |
| H01L 25/18 | (2006.01) |
| H01L 25/16 | (2006.01) |

(52) U.S. Cl.
CPC ............ *H01L 23/043* (2013.01); *H01L 25/07* (2013.01); *H01L 25/18* (2013.01)

(58) Field of Classification Search
CPC ..................................................... H01L 23/495
See application file for complete search history.

(56) References Cited

U.S. PATENT DOCUMENTS

| 2015/0061098 A1* | 3/2015 | Imoto ..................... H01L 23/24 257/676 |
| 2015/0061105 A1* | 3/2015 | Oose ..................... H01L 23/051 257/704 |
| 2015/0156909 A1* | 6/2015 | Kwak ..................... H01L 24/49 361/747 |

FOREIGN PATENT DOCUMENTS

| JP | 2011-077463 A | 4/2011 |
| JP | 2012-138531 A | 7/2012 |
| JP | 2015-046416 A | 3/2015 |

(Continued)

OTHER PUBLICATIONS

International Search Report issued in PCT/JP2017/039517; dated Jan. 16, 2018.

(Continued)

*Primary Examiner* — Omar F Mojaddedi
(74) *Attorney, Agent, or Firm* — Studebaker & Brackett PC (57) ABSTRACT

In the semiconductor device, a screw has a head section embedded in a case groove section provided in a frame placing stage of a case to cause side and front surfaces of the head section to be covered by the case, thereby fixing the screw to the case. A threaded section passes through a frame through hole of a frame exposed section disposed above the head section to protrude upward to be exposed on a side facing away from the base plate.

10 Claims, 8 Drawing Sheets

(56) References Cited

FOREIGN PATENT DOCUMENTS

JP          2016-018866  A       2/2016

OTHER PUBLICATIONS

An Office Action mailed by the Japanese Patent Office dated Jul. 7, 2020, which corresponds to Japanese Patent Application No. 2019-550071 and is related to U.S. Appl. No. 16/647,420.

* cited by examiner

SEMICONDUCTOR DEVICE, PRODUCTION METHOD THEREFOR, AND AUTOMOBILE

TECHNICAL FIELD

The present invention relates to a semiconductor device, a production method for the semiconductor device, and an automobile including the semiconductor device as a component, the semiconductor device being used in power semiconductor devices such as IGBTs, MOSFETs, and diodes and having a semiconductor chip surface connected to a frame serving as an external lead to draw a current.

BACKGROUND ART

When power semiconductor devices such as insulated gate bipolar transistors (IGBT), MOSFETs, and diodes are constructed, a semiconductor device with a frame for external connection may be used, the semiconductor device having a semiconductor chip surface connected to the frame serving as an external lead to draw a current to the outside.

In the semiconductor device with a frame for external connection described above, it is desired that an inductance of package wiring be made smaller. In particular, in a semiconductor device with a frame for external connection, the semiconductor device including a semiconductor element made of SiC that easily oscillates due to the influence of inductance, it is desired that the inductance of package wiring being made smaller to reduce voltage oscillation in high-frequency operation.

As such a semiconductor device with a frame for external connection, a configuration where a nut is enclosed in a terminal block in a case and is covered with a frame exposed section that is a portion of the frame and is exposed outside the case has been disclosed in, for example, Patent Document 1.

PRIOR ART DOCUMENTS

Patent Documents

Patent Document 1: Japanese Patent Application Laid-Open No. 2015-46416 (FIG. 7 to FIG. 9)

SUMMARY

Problem to be Solved by the Invention

In the technique disclosed in Patent Document 1, the frame of the semiconductor device with a frame for external connection and an external terminal are connected to each other through a screw fixing process using a screw and a nut with the screw disposed above the nut and the nut disposed below the screw, but, reducing a thickness of the nut to increase frictional force and axial force between the screw and the nut is difficult. In particular, a semiconductor device applicable to automobiles needs to have vibration resistance, and it is thus difficult to reduce tightening torque. Furthermore, since it is necessary to provide a space for insulation from a base plate with a nominal diameter of a threaded section maintained, the threaded section extending downward in a threaded section housing space of the terminal block enclosed in the case, the nut needs to be formed further away from the base plate.

In the semiconductor device with a frame for external connection as disclosed in Patent Document 1, the nut is formed thick, and further, the screw and the nut are arranged apart from the base plate with insulation equivalent to the nominal diameter of the threaded section maintained, the frame exposed section of the frame for connection to an external terminal disposed on the nut is necessarily disposed away from the base plate.

This causes incompatibility, in which, for example, as a formation length of the frame, that is, a wiring length becomes longer, the inductance increases, and an effect of making the inductance smaller by an eddy current generated in the base plate becomes weak, leading to an increase in inductance of the conventional semiconductor device with a frame for external connection.

The present invention has been made to solve such problems, and it is therefore an object of the present invention to provide a semiconductor device that includes a frame for external connection and is made smaller in inductance.

Means to Solve the Problem

A semiconductor device of a first aspect according to the present invention includes a base plate, an insulation substrate provided on the base plate, a circuit pattern provided on the insulation substrate, a semiconductor element provided on the circuit pattern, a frame provided on the semiconductor element to be electrically connected to the semiconductor element, and a case provided on the base plate to surround the insulation substrate, the circuit pattern, the semiconductor element, and the frame in a housing area, the case having an insulation property. In the semiconductor device, the frame includes a frame body section provided in the housing area, and a frame exposed section provided extending from the frame body section to an outside of the housing area and exposed on the case, the frame exposed section including a frame through hole. The semiconductor device further includes a screw provided to cause a head section to be covered by the case and cause a threaded section to pass through the frame through hole of the frame exposed section to protrude in a direction away from the base plate.

A semiconductor device according to a second aspect of the present invention includes a base plate, an insulation substrate provided on the base plate, first and second circuit patterns provided on the insulation substrate, a semiconductor element provided on the first circuit pattern, a frame provided on the semiconductor element and the second circuit pattern to be electrically connected to the semiconductor element and the second circuit pattern, and a case provided on the base plate to surround the insulation substrate, the first and second circuit patterns, the semiconductor element, and the frame in a housing area. In the semiconductor device, the frame includes a frame body section provided in the housing area, a frame exposed section provided extending from the frame body section to an outside of the housing area and exposed on the case, and a frame bent section further extending from the frame exposed section and extending, after a distal end portion is bent, in a direction opposite to a direction in which the frame exposed section extends, the frame exposed section including a frame through hole, and the frame bent section being connected to the second circuit pattern. The semiconductor device further includes a screw provided to cause a head section to be covered by the case and cause a threaded section to pass through the frame through hole to protrude in a direction away from the base plate, the screw being supported by the frame bent section from below a front surface of the head section.

Effects of the Invention

Since the screw of the semiconductor device according to the first aspect of the present invention is provided to cause the threaded section to pass through the frame through hole to protrude in a direction away from the base plate, the external terminal and the frame can be electrically connected to each other outside the case through a screw fixing process in which the threaded section is passed through a through hole of the external terminal and is then fixed with a nut.

At this time, it is possible to interpose only the head section of the screw between the base plate and the frame exposed section of the frame and thus to shorten the formation length of the frame, that is, a wiring length of the semiconductor device, which in turn makes it possible to minimize the inductance of the semiconductor device.

Since the screw of the semiconductor device according to the second aspect of the present invention is provided to cause the threaded section to pass through the frame through hole to protrude in a direction away from the base plate, the external terminal and the frame can be electrically connected to each other outside the case by causing the threaded section to pass through a through hole of the external terminal and fixing the threaded section with a nut.

At this time, with respect to the screw and the frame, since it is possible to interpose only the head section of the screw and the frame bent section between the base plate and the frame exposed section of the frame, the formation length of the frame, that is, a wiring length of the semiconductor device, can be shortened. As a result, it is possible to minimize the inductance of the semiconductor device.

In addition, since the screw is supported by the frame bent section provided below the front surface of the head section, it is possible to attach the screw to the case by a relatively simple method without using a nut for temporary fixing.

Furthermore, since the frame bent section is connected to the second circuit pattern to allow the second circuit pattern and the insulation substrate to dissipate heat generated in the frame to the base plate, it is possible to make the current density and heat resistance of the semiconductor device higher.

The object, features, aspects, and advantages of the present invention will become more apparent from the following detailed description and the accompanying drawings.

DESCRIPTION OF EMBODIMENTS

First Embodiment

Configuration

Figure 1:
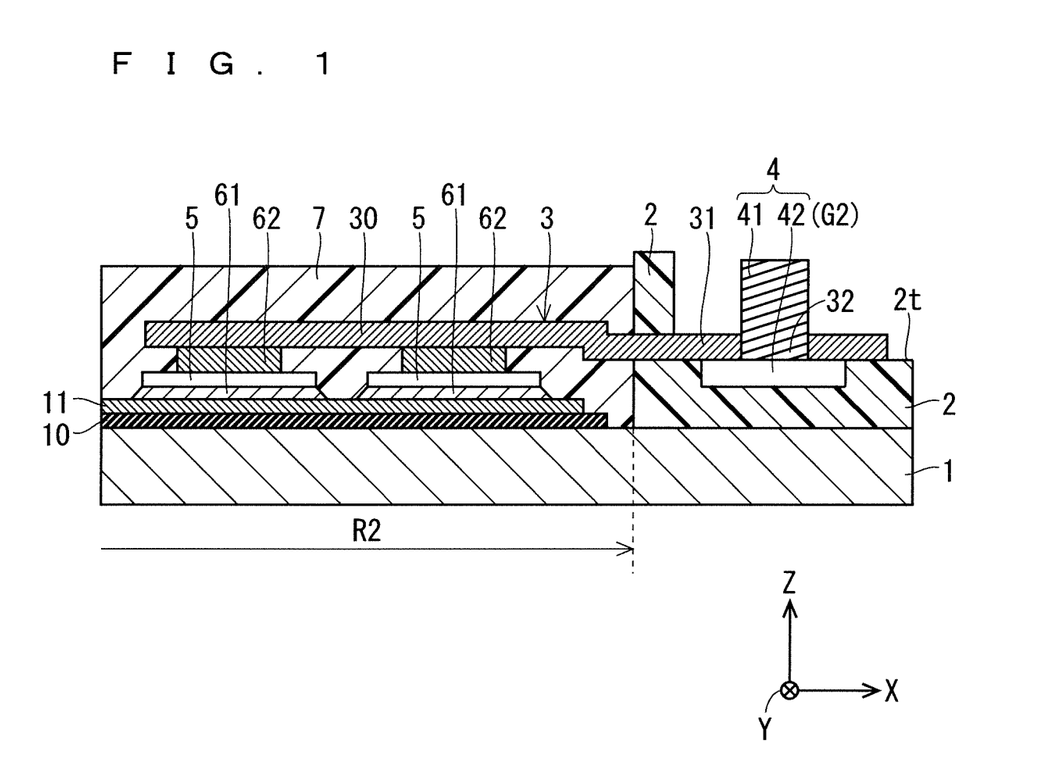
FIG. 1 is a cross-sectional view schematically showing a cross-sectional structure of a semiconductor device according to a first embodiment of the present invention.
Figure 2:
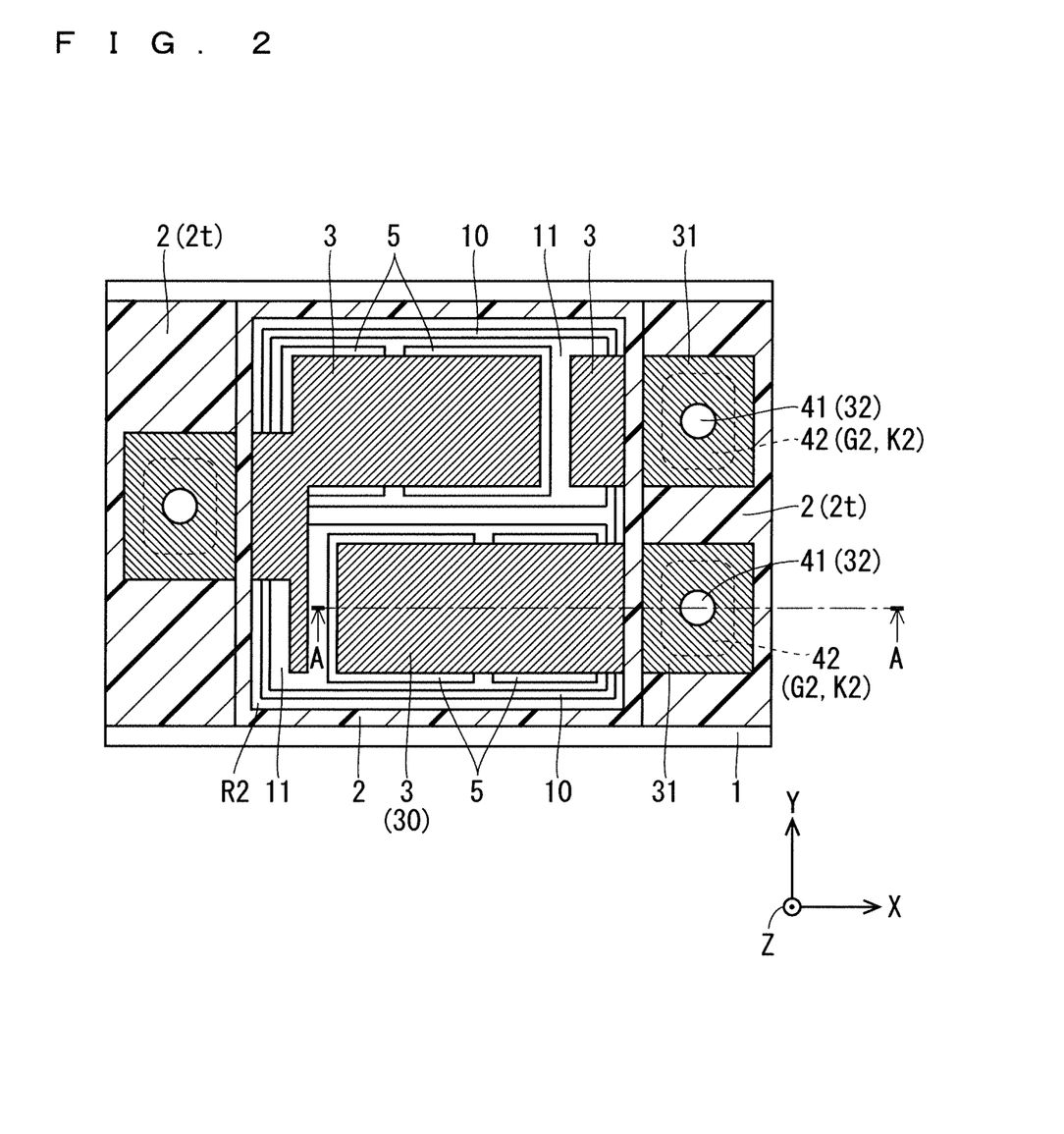
FIG. 2 is a plan view schematically showing a planar structure of the semiconductor device according to the first embodiment.

FIG. 1 is a cross-sectional view schematically showing a cross-sectional structure of a semiconductor device according to a first embodiment of the present invention. FIG. 2 is a plan view schematically showing a planar structure of the semiconductor device according to the first embodiment, and an A-A cross section of FIG. 2 corresponds to FIG. 1. In FIG. 1 and FIG. 2, an XYZ orthogonal coordinate system is shown. Note that, in FIG. 2, for convenience of explanation, no illustration of a resin-covering section 7 to be described later will be given.

As shown in these drawings, an insulation substrate 10 is provided on a base plate 1, and a wiring pattern 11 serving as a circuit pattern is provided on the insulation substrate 10.

Two semiconductor elements 5 are provided separately from each other on the wiring pattern 11 and are each bonded to the wiring pattern 11 by solder 61 to be electrically connected to the wiring pattern 11.

In addition, a frame 3 serving as an external lead is provided on the two semiconductor elements 5, and the two semiconductor elements 5 are bonded to a frame body section 30 of the frame 3 by solder 62 to be electrically connected to the frame 3.

A case 2 made of resin is provided on the base plate 1 to surround a housing area R2. In the housing area R2, a basic structure of the semiconductor device including the insulation substrate 10, the wiring pattern 11, the two semiconductor elements 5, and the frame body section 30 of the frame 3 are housed.

In the housing area R2, the insulation substrate 10, the wiring pattern 11, the two semiconductor elements 5, the solder 61, 62, and the frame body section 30 of the frame 3 are covered with an encapsulating material such as resin, thereby forming the resin-covering section 7. As described above, the resin-covering section 7 serves as a housing area covering section that covers the basic structure in the housing area R2 with the encapsulating material.

The frame 3 includes the above-described frame body section 30 provided in the housing area R2 and a frame exposed section 31 provided extending from the frame body section 30 to an outside of the housing area R2 in a +X direction and exposed on a frame placing stage 2t located outside the case 2, and the frame exposed section 31 includes a frame through hole 32.

Furthermore, a screw 4 is provided on the frame placing stage 2t of the case 2 located outside the housing area R2, the screw 4 including a threaded section 41 located on an upper side of the screw 4 and a head section 42 located on a lower side of the screw 4. The head section 42 of the screw 4 is embedded in a case groove section G2 provided in the frame placing stage 2t of the case 2 to cause side and lower (−Z direction) surfaces of the head section 42 to be covered by the case 2, thereby fixing the screw 4 to the case 2.

On the other hand, the threaded section 41 is exposed without being covered by the frame placing stage 2t. That is, the threaded section 41 is provided passing through the frame through hole 32 of the frame exposed section 31 disposed above the head section 42 to protrude upward (+Z direction) to be exposed on a side facing away from the base plate 1.

Furthermore, the head section 42 of the screw 4 is embedded in the case groove section G2 of the frame placing stage 2t of the case 2 with a portion of the case 2 interposed between the head section 42 and the base plate 1. That is, the screw 4 is fixed to the case 2 with the head section 42 surrounded by the frame placing stage 2t of the case 2.

The case 2 is made of, for example, PPS resin and thus has an insulation property, and the frame 3 is made of copper and thus has conductivity. The wiring pattern 11 serving as a circuit pattern is made of, for example, copper or aluminum and thus has conductivity. When aluminum is used, a surface of the wiring pattern 11 is plated with nickel or the like to allow the wiring pattern 11 and the semiconductor elements 5 to be bonded to each other by the solder 61.

The base plate 1 is made of, for example, copper or aluminum and thus has conductivity, and the insulation substrate 10 is made of alumina, silicon nitride, aluminum nitride, or the like and thus has an insulation property.

As shown in FIG. 2, of the screw 4, a whole of the head section 42 is placed on the frame exposed section 31 in plan view of an XY plane, and the threaded section 41 coincides with the frame through hole 32 in plan view of the XY plane.

The head section 42 has a rectangular shape in plan view and is disposed such that sides extending in a frame length direction (X direction) in which the frame exposed section 31 extends from the frame body section 30 serve as short sides, and sides extending in a frame width direction (Y direction) orthogonal to the frame length direction serve as long sides. As described above, the frame exposed section 31 is provided on the frame placing stage 2t of the case 2 to cover the whole of the head section 42 having a rectangular shape in plan view. Note that, as shown in FIG. 2, corners of the head section 42 may be rounded.

As shown in FIG. 2, the case 2 has a rectangular shape in plan view, and the frame exposed section 31 is disposed on the frame placing stage 2t of the case 2 such that a long-side direction of the case 2 coincides with the X direction serving as the frame length direction of the frame exposed section 31, and a short-side direction of the case 2 coincides with the Y direction serving as the frame width direction of the frame exposed section 31.

Production Method

A description will be given of a production method for the semiconductor device according to the first embodiment with reference to FIG. 1 and FIG. 2.

First, a preparation process of obtaining the basic structure by integrating the insulation substrate 10, the wiring pattern 11, and the two semiconductor elements 5 on the base plate 1 is performed. Note that, in the preparation process, the two semiconductor elements 5 and the wiring pattern 11 are bonded with the solder 61 interposed between the two semiconductor elements 5 and the wiring pattern 11.

Next, a production process of producing the case 2 is performed in which, with the frame 3 and the screw 4 fixed to a mold (not shown), a case forming resin is injected into the mold to surround the head section 42, thereby forming the case 2 integrally with the frame 3 and the screw 4. Note that the above-described preparation process and the production process of producing the case 2 may be performed in reverse order.

Subsequently, a fixing process of fixing the case 2 to the base plate 1 is performed, and a bonding process of bonding the semiconductor elements 5 and the frame 3 with the solder 62 is further performed.

The case 2 that has been fixed to the base plate 1 surrounds the housing area R2 where the basic structure including the insulation substrate 10, the wiring pattern 11, and the two semiconductor elements 5, and the frame body section 30 of the frame 3 are housed.

The semiconductor elements 5 each contain, for example, silicon carbide (SiC) as a major constituent, the silicon carbide being a compound mainly composed of carbon, and include a MOSFET, a Schottky barrier diode, and the like. Solder bonding electrodes (not shown) are provided on front and back surfaces of each of the semiconductor elements 5 to be electrically connected to the frame 3 with the solder 62 interposed between the semiconductor elements 5 and the frame 3 and to be further electrically connected to the wiring pattern 11 with the solder 61 interposed between the semiconductor elements 5 and the wiring pattern 11. The above-described solder bonding electrodes are made of a material containing nickel and can be formed on the semiconductor elements 5 by, for example, wet plating or vapor deposition such as sputtering or evaporation.

In the fixing process of fixing the case 2 to the base plate 1, the case 2 is disposed on the base plate 1 with a bottom surface of the case 2 facing a front surface of the base plate 1 and bonded to the base plate 1 with, for example, silicone adhesive. When the case 2 is fixed to the base plate 1, the housing area R2 where the insulation substrate 10, the wiring pattern 11, the two semiconductor elements 5, and the frame body section 30 of the frame 3 are housed is surrounded by the case 2.

Finally, a resin covering process is performed in which the resin-covering section 7 serving as the housing area covering section is formed where the basic structure and the frame body section 30 of the frame 3 in the housing area R2 of the case 2 are covered with an encapsulating material such as resin, and, as a result, the semiconductor device according to the first embodiment is completed.

In the resin covering process, the encapsulating material is injected into the housing area R2 surrounded by the case 2 and the base plate 1 to form the resin-covering section 7, thereby making insulation from the outside and moisture resistance maintained. The encapsulating material is made of, for example, a two-component mixed epoxy resin and can be hardened by heat treatment in which heat is applied to the encapsulating material after the injection to form the resin-covering section 7.

After the completion of the semiconductor device according to the first embodiment, although not shown, the threaded section 41 exposed upward (+Z direction) of the screw 4 is passed through an external terminal such as a bus bar that has a through hole formed through a center of the external terminal, and is then fixed with a nut (not shown), thereby allowing the semiconductor device according to the first embodiment to connect to an external capacitor module, an external output, or the like through the external terminal electrically connected to the frame 3.

Effects

Since the screw 4 of the semiconductor device according to the first embodiment including the threaded section 41 located on the upper side of the screw 4 and the head section 42 located on the lower side of the screw 4 is provided to cause the threaded section 41 to pass through the frame through hole 32 to protrude in the +Z direction away from the base plate 1, the external terminal and the frame 3 can be electrically connected to each other outside the case 2 through a screw fixing process in which the threaded section 41 is passed through the through hole of the external terminal and is then fixed with a nut.

At this time, it is possible to interpose only the head section 42 of the screw 4 between the base plate 1 and the frame exposed section 31 of the frame 3 and thus to shorten the formation length of the frame 3, that is, a wiring length of the semiconductor device, which in turn makes it possible to minimize an inductance of the semiconductor device according to the first embodiment.

A description will be given in detail below of points that allow the formation length of the frame 3 to be shortened. The structure where the frame 3 and the screw 4 that are integrally formed with each other makes it possible to eliminate the need of providing, in the case 2, a nut used for fixing the external terminal and a nut box serving as a housing area where the nut is housed, and thus a formation height of the frame exposed section 31 can be designed as low as possible to allow the frame exposed section 31 to be located close to the base plate 1.

This makes it possible to make the formation length of the frame 3 shorter and thus make the inductance smaller. In addition, an inductance canceling effect due to an eddy current generated in the base plate 1 can be obtained more effectively, and the inductance of the semiconductor device according to the first embodiment is further reduced accordingly.

Furthermore, the semiconductor device according to the first embodiment has a head section shape placement feature where the head section 42 has a rectangular shape in plan view and is disposed such that sides extending in the frame length direction (X direction) in which the frame exposed section 31 extends from the frame body section 30 serve as the short sides, and sides extending in the frame width direction (Y direction) orthogonal to the frame length direction serve as the long sides.

Since the semiconductor device according to the first embodiment has the above-described head section shape placement feature, it is possible to reduce the formation length of the frame 3 by making the length of the frame exposed section 31 in the frame length direction as short as possible and making the length of the frame exposed section 31 in the frame width direction as long as possible to further reduce the inductance of the semiconductor device according to the first embodiment. A description will be given below of this effect.

Since the screw 4 has the head section shape placement feature, the length in the frame length direction of the frame exposed section 31 that covers the head section 42 in plan view can be made as short as possible. On the other hand, in order to reduce contact resistance between the frame exposed section 31 of the frame 3 serving as an external lead and the external terminal serving as an external electrode, the frame exposed section 31 needs to have a certain area.

However, since the inductance increases as the frame exposed section 31 of the frame 3 is extended in a direction away from the semiconductor elements 5 (+X direction), it is desirable to increase the length of the frame exposed section 31 in the frame width direction (Y direction).

Therefore, when the head section 42 has a rectangular shape and is disposed such that the long sides extends in the Y direction parallel to the frame width direction, the contact resistance between the external terminal and the frame 3 can be reduced without an increase in inductance.

For a semiconductor device in which the head section 42 is tightened by rotation, it is desirable that the head section 42 be a screw head section that has a regular hexagonal shape in plan view to be easily engaged with a screw fixing tool, but the semiconductor device according to the first embodiment eliminates the need of rotating the head section 42 and only requires that the head section 42 do not slip during screw fixing, which eliminates the need of taking into consideration the handleability of the screw fixing tool and thus makes it possible to use the head section 42 having a rectangular shape in plan view without hindrance.

In addition, making the length of the frame exposed section 31 in the frame width direction long enough allows the frame exposed section 31 to be put between the head section having a rectangular shape in plan view and the nut with a relatively wide contact area when the frame is electrically connected to an external terminal such as a bus bar serving as an external electrode by screw fixing using the nut. This in turn allows the semiconductor device according to the first embodiment to have a high vibration resistance characteristic with low contact resistance between the external terminal and the frame exposed section 31 during screw fixing.

Furthermore, according to the first embodiment, the head section 42 of the screw 4 is embedded in the case groove section G2 of the case 2 with a portion of the case 2 serving as a resin insulation area interposed between the head section 42 and the base plate 1.

Therefore, in the semiconductor device according to the first embodiment, it is possible to reliably insulate the frame exposed section 31 that is connected to the external terminal to be a strong electric section from the base plate 1 with an insulation area that is the portion of the case 2 interposed between the frame exposed section 31 and the base plate 1.

In addition, since the head section 42 of the screw 4 is embedded in the case groove section G2 of the case 2, the head section 42 of the screw 4 can be stably fixed in the case 2.

Furthermore, in the semiconductor device according to the first embodiment, the use of the semiconductor elements 5 each containing, as a major constituent, a compound mainly composed of carbon such as SiC makes it possible to increase a current density of the semiconductor elements 5.

A semiconductor device containing a compound mainly composed of carbon such as SiC has a characteristic that voltage oscillation tends to occur due to the influence of wiring inductance. Since the semiconductor device according to the first embodiment has the inductance made as small as possible, it is possible to put the semiconductor device containing a compound mainly composed of carbon such as SiC into operation at higher frequencies to reduce loss during operation. A description will be given in detail below of this point.

A semiconductor element containing, as a major constituent, a compound semiconductor mainly composed of carbon such as SiC is often used as a unipolar device, so that such a semiconductor element can suppress switching loss and is suitable for use at high frequencies.

In order to further reduce the switching loss when used at high frequencies, it is preferable to increase di/dt that represents a current change at the time of switching as high as possible, but a large inductance causes oscillation. Since the semiconductor device according to the first embodiment is a semiconductor device having the inductance made as small as possible as described above, it is possible to put the semiconductor device into operation with di/dt increased to reduce loss during operation.

Second Embodiment

Configuration

Figure 3:
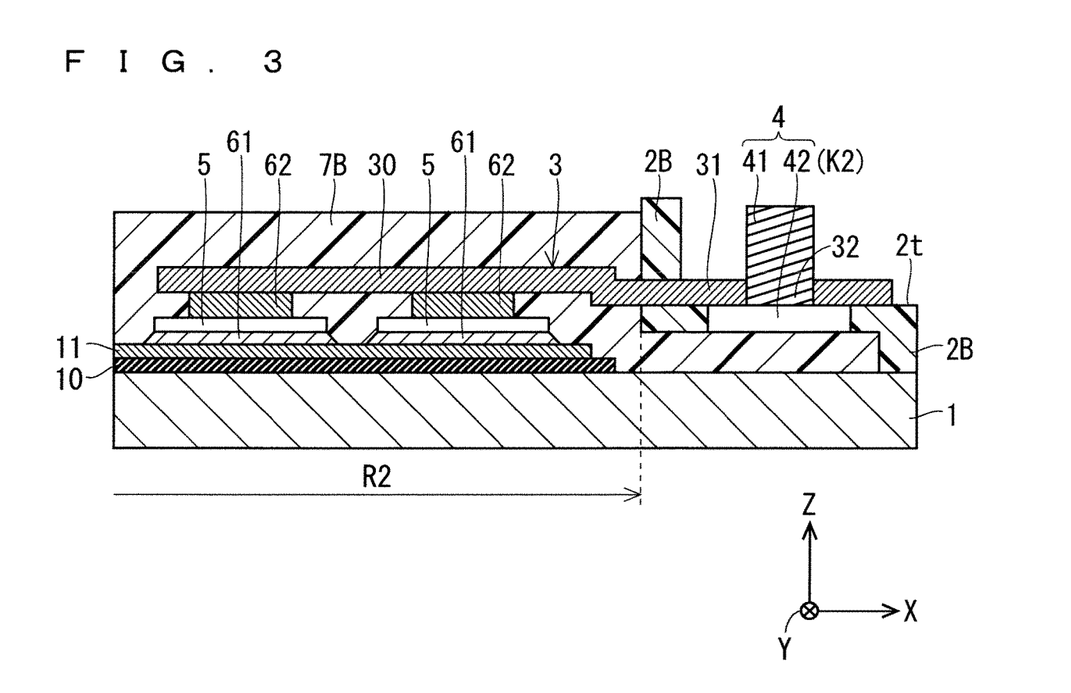
FIG. 3 is a cross-sectional view schematically showing a cross-sectional structure of a semiconductor device according to a second embodiment of the present invention.

FIG. 3 is a cross-sectional view schematically showing a cross-sectional structure of a semiconductor device according to a second embodiment of the present invention. In FIG. 3, an XYZ orthogonal coordinate system is shown.

Note that a planar structure of the semiconductor device according to the second embodiment is the same as the structure according to the first embodiment shown in FIG. 2, and the A-A cross section of FIG. 2 corresponds to FIG. 3.

A description will be given below mainly of differences from the semiconductor device according to the first embodiment with reference to FIG. 3. Note that the same components as the components according to the first embodiment shown in FIG. 1 and FIG. 2 are denoted by the same reference numerals, and no description will be given of the components as appropriate.

As shown in FIG. 3, in the semiconductor device according to the second embodiment, the head section 42 of the screw 4 is covered in a case opening section K2 of a case 2B such that the front surface of the head section 42 (the surface on a -Z direction side) of the screw 4 is exposed and covered by a resin-covering section 7B serving as a housing area covering section.

That is, in the semiconductor device according to the second embodiment, as shown in FIG. 3, the head section 42 of the screw 4 has side surfaces surrounded by the case 2B made of resin, and has the front surface in the -Z direction covered by the resin-covering section 7B rather than the case 2B. Therefore, the screw 4 is supported by the resin-covering section 7B provided below the front surface of the head section 42. Note that the case 2B is identical in component material to the case 2 according to the first embodiment, and the resin-covering section 7B is identical in component material to the resin-covering section 7 according to the first embodiment.

Production Method

FIG. 4 to FIG. 8 are cross-sectional views of the semiconductor device according to the second embodiment, showing a production method for the semiconductor device. In FIG. 4 to FIG. 8, an XYZ orthogonal coordinate system is shown. A description will be given below of the production method for the semiconductor device according to the second embodiment with reference to FIG. 4 to FIG. 8.

Figure 4:
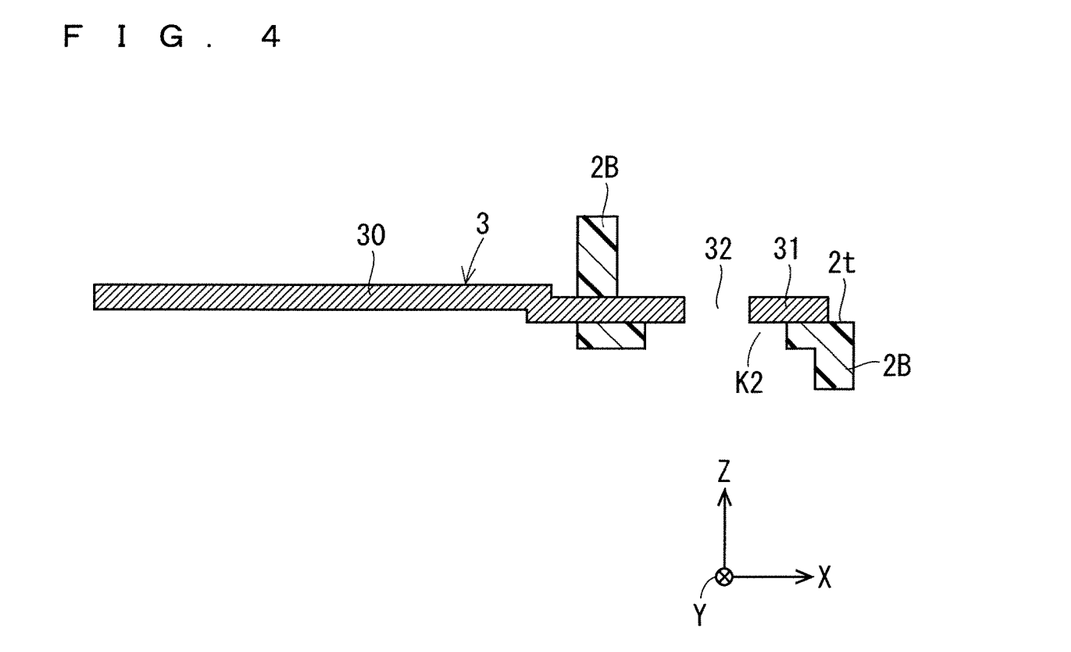
FIG. 4 is a cross-sectional view of the semiconductor device according to the second embodiment, showing a production method for the semiconductor device.

First, as in the first embodiment, the preparation process of obtaining the basic structure by integrating the insulation substrate 10, the wiring pattern 11, and the two semiconductor elements 5 on the base plate 1 is performed.

Next, a production process of producing the case 2B is performed in which, with the frame 3 fixed to a mold (not shown), a case forming resin is injected into the mold to form the case 2B integrally with the frame 3 as shown in FIG. 4. Note that the above-described preparation process and the production process of producing the case 2B may be performed in reverse order.

As shown in FIG. 4, the case 2B is provided with the case opening section K2 into which the screw 4 is inserted, and the case opening section K2 is connected to the frame through hole 32.

Figure 5:
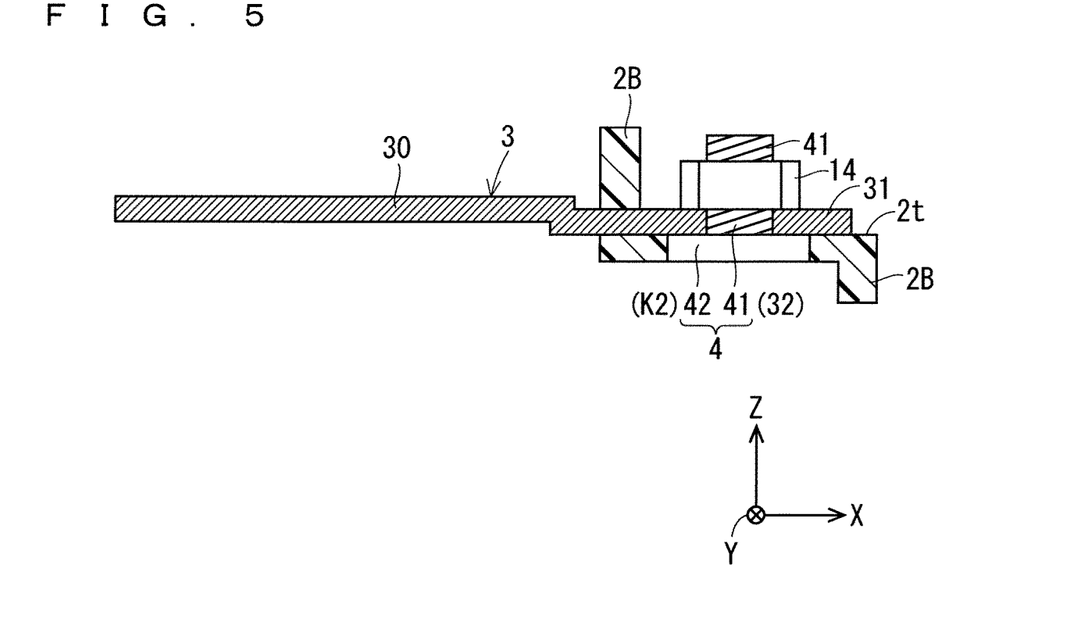
FIG. 5 is a cross-sectional view of the semiconductor device according to the second embodiment, showing the production method for the semiconductor device.

Next, as shown in FIG. 5, a temporary fixing process is performed in which the threaded section 41 of the screw 4 is inserted from the case opening section K2 to pass through the frame through hole 32 such that the head section 42 of the screw 4 is fitted into the case opening section K2 of the case 2B, and the threaded section 41 is exposed upward from the frame through hole 32. Then, the head section 42 thus exposed is fixed with a nut 14 to temporarily fix the case 2B and the screw 4.

Figure 6:
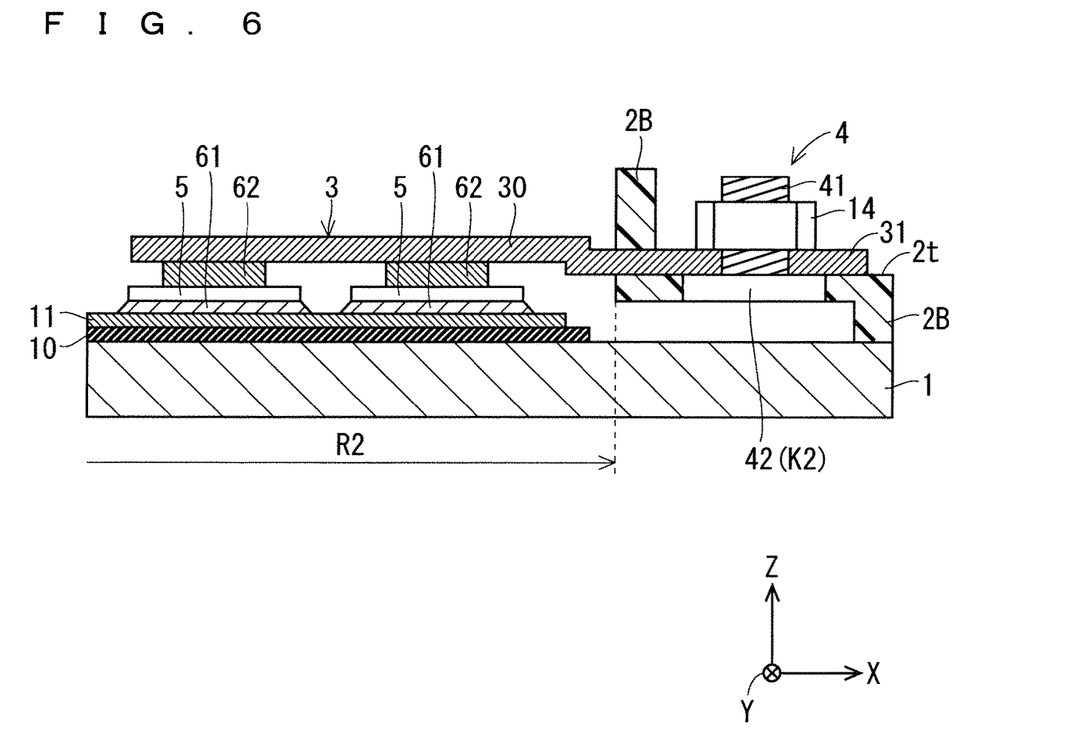
FIG. 6 is a cross-sectional view of the semiconductor device according to the second embodiment, showing the production method for the semiconductor device.

Subsequently, as shown in FIG. 6, as in the first embodiment, the fixing process of fixing the case 2B to the base plate 1 is performed, and the bonding process of bonding the semiconductor elements 5 and the frame 3 with the solder 62 is further performed.

The case 2B after being fixed to the base plate 1 surrounds the housing area R2 where the basic structure including the insulation substrate 10, the wiring pattern 11, and the two semiconductor elements 5, and the frame body section 30 of the frame 3 are housed.

Figure 7:
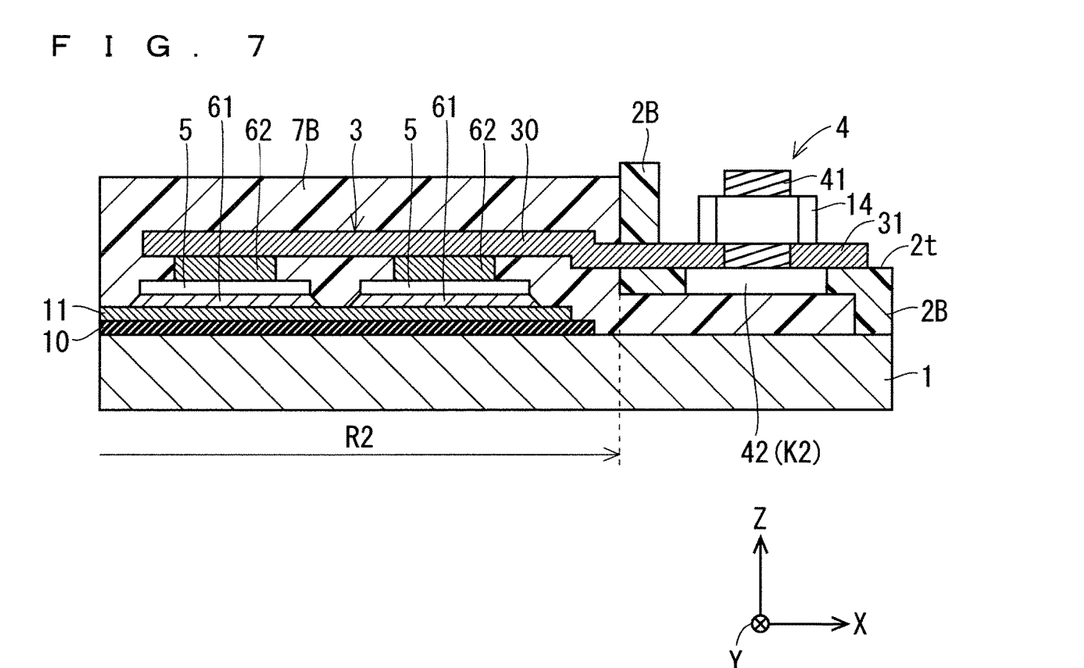
FIG. 7 is a cross-sectional view of the semiconductor device according to the second embodiment, showing the production method for the semiconductor device.

Subsequently, as shown in FIG. 7, a resin covering process is performed in which the resin-covering section 7B is formed where the basic structure, the frame body section 30 in the housing area R2 of the case 2B, and the front surface of the head section 42 in the -Z direction are covered with an encapsulating material.

Figure 8:
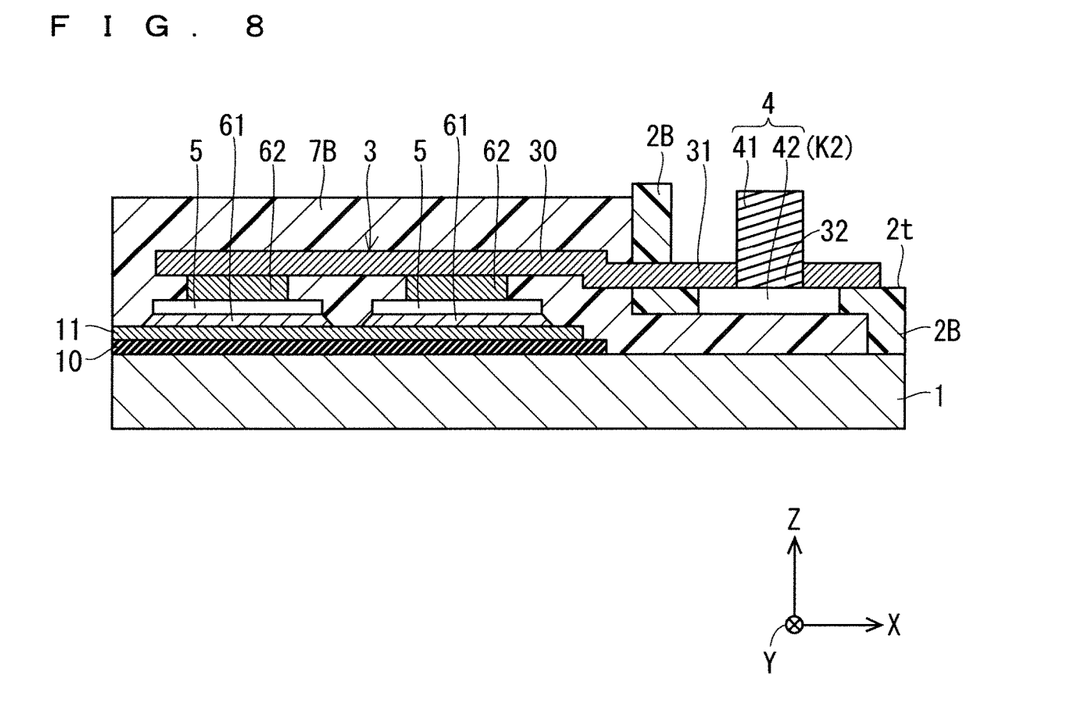
FIG. 8 is a cross-sectional view of the semiconductor device according to the second embodiment, showing the production method for the semiconductor device.

Finally, after hardening the encapsulating material of the resin-covering section 7B by heat treatment or the like, as shown in FIG. 8, a release process of releasing the above-described temporary fixing is performed in which the nut 14 is removed from the threaded section 41 of the screw 4, and, as a result, the semiconductor device according to the second embodiment is completed.

Effects

As in the first embodiment, since the screw 4 of the semiconductor device according to the second embodiment is provided to cause the threaded section 41 to pass through the frame through hole 32 to protrude in the +Z direction away from the base plate 1, it is possible to minimize the inductance of the semiconductor device according to the second embodiment.

Furthermore, since the screw 4 of the semiconductor device according to the second embodiment has the above-described head section shape placement feature as in the first embodiment, it is possible to achieve a high vibration resistance characteristic while further reducing the inductance and reducing the contact resistance between the external terminal and the frame exposed section 31 during screw fixing.

In addition, according to the second embodiment, the head section 42 of the screw 4 is covered by the case 2B with the front surface of the head section 42 exposed, and further, the front surface of the head section 42 of the screw 4 is covered by the resin-covering section 7B serving as the housing area covering section.

Therefore, in the semiconductor device according to the second embodiment, it is possible to reliably insulate the frame exposed section 31 that is connected to the external terminal to be a strong electric section from the base plate 1 with a resin insulation area that is the portion of the resin-covering section 7B covering the front surface of the head section 42.

Furthermore, in the semiconductor device according to the second embodiment, as in the first embodiment, the use of the semiconductor elements 5 each containing, as a major constituent, a compound mainly composed of carbon such as SiC makes it possible to increase a current density of the semiconductor elements 5.

In addition, since the production method for the semiconductor device according to the second embodiment eliminates the need of integrating the screw 4 with the case 2B when the case 2B is formed, the case 2B can be formed by a relatively simple method, and a production cost can be suppressed accordingly.

In addition, the relatively simple method based on the series of processes shown in FIG. 5 to FIG. 8 including the temporary fixing process of temporarily fixing the case 2B and the screw 4, the bonding process of bonding the semiconductor elements 5 and the frame 3, the resin covering process, and the release process of releasing temporary fixing is performed. Thereafter, the resin-covering section 7B serving as the housing area covering section that further covers the front surface of the head section 42 is formed to allow insulation between the screw 4 and the base plate 1 to be maintained.

Then, the presence of the resin-covering section 7B formed below the front surface of the head section 42 of the screw 4 allows the screw 4 to be stably fixed to the case 2B.

Third Embodiment

Configuration

Figure 9:
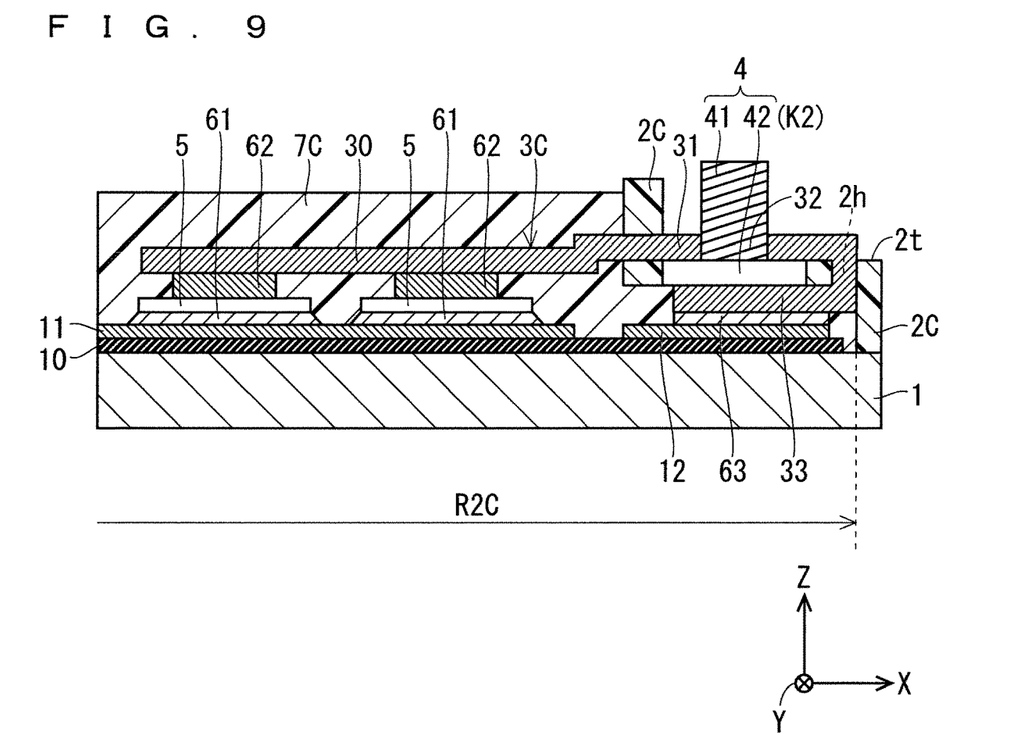
FIG. 9 is a cross-sectional view schematically showing a cross-sectional structure of a semiconductor device according to a third embodiment of the present invention.

FIG. 9 is a cross-sectional view schematically showing a cross-sectional structure of a semiconductor device according to a third embodiment of the present invention. In FIG. 9, an XYZ orthogonal coordinate system is shown.

Note that a planar structure of the semiconductor device according to the third embodiment is the same as the structure according to the first embodiment shown in FIG. 2, and the A-A cross section of FIG. 2 corresponds to FIG. 9.

As shown in FIG. 9, the insulation substrate 10 is provided on the base plate 1, and a wiring pattern 12 serving as a second circuit pattern is provided on the insulation substrate 10 in addition to the wiring pattern 11 serving as a first circuit pattern.

The two semiconductor elements 5 are provided separately from each other on the wiring pattern 11 and are each bonded to the wiring pattern 11 by the solder 61 to be electrically connected to the wiring pattern 11.

In addition, a frame 3C is provided on the two semiconductor elements 5, and the two semiconductor elements 5 are bonded to the frame body section 30 of the frame 3C by the solder 62 to be electrically connected to the frame 3C.

A case 2C made of resin is provided on the base plate 1 to surround a housing area R2C. In the housing area R2C, the insulation substrate 10, the two wiring patterns 11, 12, the two semiconductor elements 5, the frame body section 30 of the frame 3C, and a frame bent section 33 of the frame 3C to be described later.

The frame 3C includes the above-described frame body section 30 provided in the housing area R2C and the frame exposed section 31 provided on the frame placing stage 2t of the case 2C, the frame exposed section 31 extending from the frame body section 30 in the +X direction to be exposed outside the housing area R2C. The frame 3C further includes the frame bent section 33 that further extends from the frame exposed section 31, is bent downward to pass through a through hole 2h of the case 2C, and is further bent to extend in the −X direction opposite to the direction in which the frame exposed section 31 extends. The frame exposed section 31 includes the frame through hole 32.

The frame bent section 33 of the frame 3C is bonded to the wiring pattern 12 by solder 63 to be electrically connected to the wiring pattern 12.

In the housing area R2C, the insulation substrate 10, the two wiring patterns 11, 12, the two semiconductor elements 5, the solder 61 to 63, the frame body section 30 of the frame 3C, and the frame bent section 33 of the frame 3C are covered with an encapsulating material such as resin, thereby providing a resin-covering section 7C.

Furthermore, the screw 4 including the threaded section 41 located on the upper side of the screw 4 and the head section 42 located on the lower side of the screw 4 is provided on the frame placing stage 2t of the case 2C outside the housing area R2C. The head section 42 of the screw 4 is fitted into the case opening section K2 provided through the frame placing stage 2t of the case 2C and has the side surfaces covered by the case 2C.

On the other hand, the threaded section 41 is exposed without being covered by the frame placing stage 2t. That is, the threaded section 41 is provided passing through the frame through hole 32 of the frame exposed section 31 disposed above the head section 42 to protrude upward (+Z direction) to be exposed on a side facing away from the base plate 1.

The screw 4 is supported by the frame bent section 33 formed below the front surface of the head section 42. Note that the frame 3C is identical in component material to the frame 3 according to the first embodiment, the case 2C is identical in component material to the case 2 according to the first embodiment, and the resin-covering section 7C is identical in component material to the resin-covering section 7 according to the first embodiment.

Production Method

Figure 10:
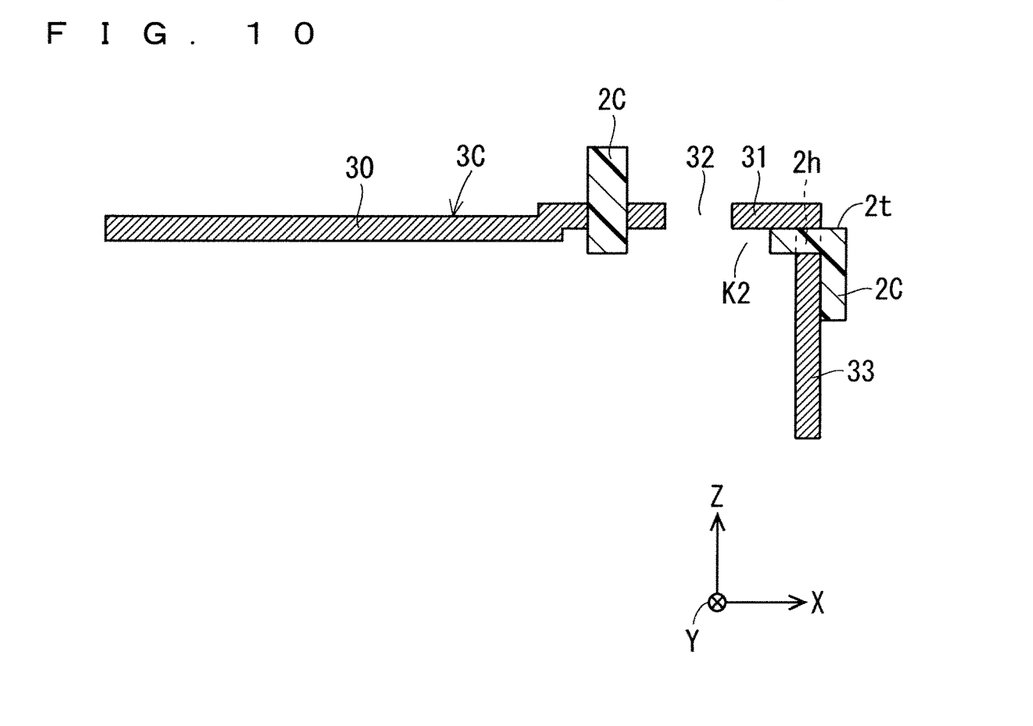
FIG. 10 is a cross-sectional view of the semiconductor device according to the third embodiment, showing a production method for the semiconductor device.
Figure 11:
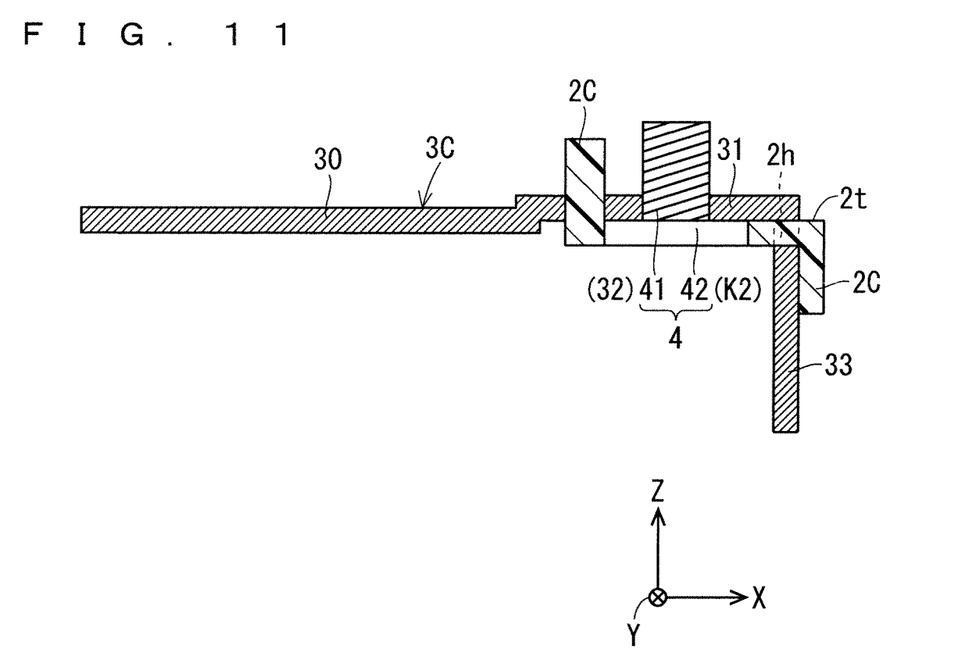
FIG. 11 is a cross-sectional view of the semiconductor device according to the third embodiment, showing the production method for the semiconductor device.
Figure 12:
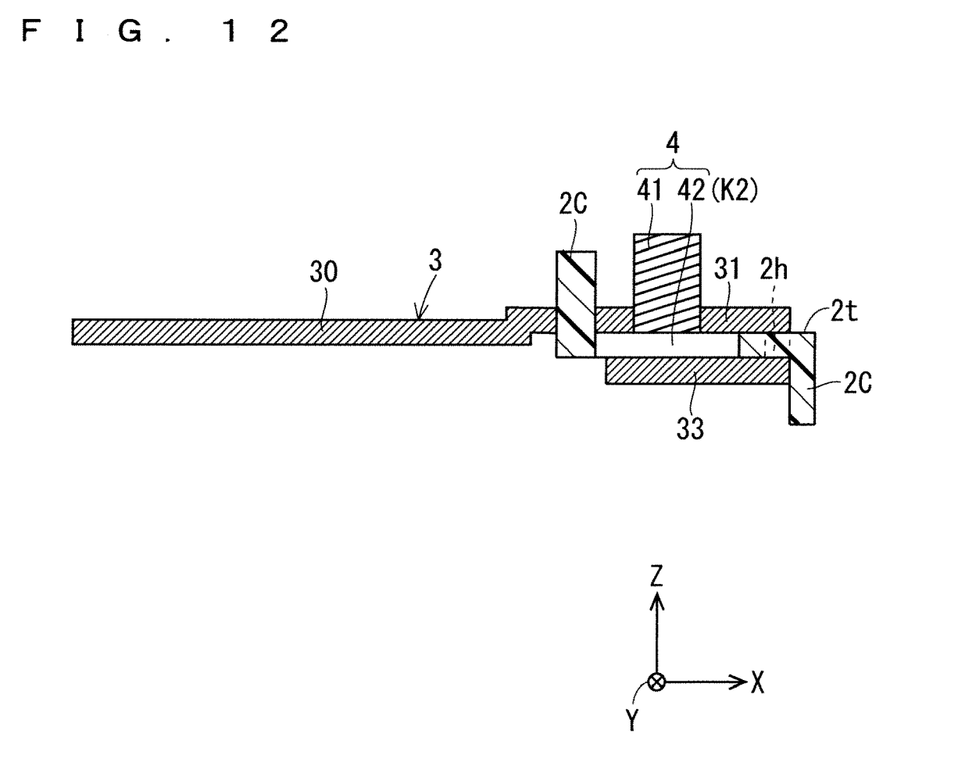
FIG. 12 is a cross-sectional view of the semiconductor device according to the third embodiment, showing the production method for the semiconductor device.

FIG. 10 to FIG. 12 are cross-sectional views of the semiconductor device according to the third embodiment, showing a production method for the semiconductor device. In FIG. 10 to FIG. 12, an XYZ orthogonal coordinate system is shown. A description will be given below of the production method for the semiconductor device according to the third embodiment with reference to FIG. 10 to FIG. 12.

First, as in the first embodiment, the preparation process of obtaining the basic structure by integrating the insulation substrate 10, the wiring pattern 11, and the two semiconductor elements 5 on the base plate 1 is performed. Note that, in the preparation process, the two semiconductor elements 5 and the wiring pattern 11 are bonded with the solder 61 interposed between the two semiconductor elements 5 and the wiring pattern 11.

Next, a production process of producing the case 2C is performed in which, with the frame 3C fixed to a mold (not shown), a case forming resin is injected into the mold to form the case 2C integrally with the frame 3C as shown in FIG. 10. Note that the above-described preparation process and the production process of producing the case 2C may be performed in reverse order.

As shown in FIG. 10, the case 2C is provided with the case opening section K2 through which the threaded section 41 of the screw 4 is inserted and in which the head section 42 is fitted, and the case opening section K2 is connected to the frame through hole 32. Further, the frame bent section 33 protrudes downward (−Z direction) through the through hole 2h separately provided through the case 2C. That is, immediately after the production process of producing the case 2C, the frame bent section 33 is in a state of extending substantially perpendicularly to the through hole 2h of the case 2C.

Next, as shown in FIG. 11, a temporary arrangement process is performed in which the threaded section 41 of the screw 4 is inserted from the case opening section K2 to pass through the frame through hole 32 such that the head section 42 of the screw 4 is fitted into the case opening section K2 of the case 2C, and the threaded section 41 is exposed upward from the frame through hole 32, thereby temporarily arranging the case 2C and the screw 4.

Subsequently, as shown in FIG. 12, a screw fixing process is performed in which the frame bent section 33 is bent to cause a distal end portion of the frame bent section 33 to extend along the front surface of the head section 42, and the screw 4 is fixed to the case 2C by support of the frame bent section 33 having the distal end portion extending in the −X direction.

Then, as in the first embodiment, the fixing process of fixing the case 2C to the base plate 1 is performed, and the bonding process of bonding the semiconductor elements 5 and the frame 3C with the solder 62 and the bonding process of bonding the frame bent section 33 and the wiring pattern 12 with the solder 63 are further performed.

Finally, a resin covering process is performed in which the resin-covering section 7C is formed where the basic structure in the housing area R2C of the case 2C, and the frame exposed section 31 and the frame bent section 33 of the frame 3 are covered with an encapsulating material such as resin, and, as a result, the semiconductor device having the structure shown in FIG. 9 is completed.

Effects

As in the first embodiment and the second embodiment, since the screw 4 of the semiconductor device according to the third embodiment is provided o cause the threaded section 41 to pass through the frame through hole 32 to protrude in the +Z direction away from the base plate 1, it is possible to minimize the inductance of the semiconductor device according to the third embodiment.

In addition, since the screw 4 of the semiconductor device according to the third embodiment is provided to cause the threaded section 41 to pass through the frame through hole 32 to protrude in a direction away from the base plate 1, the external terminal and the frame 3C can be electrically connected to each other outside the case 2C by causing the threaded section 41 to pass through a through hole of the external terminal and fixing the threaded section 41 with a nut.

At this time, with respect to the screw 4 and the frame 3C, since it is possible to interpose only the head section 42 of the screw 4 and the frame bent section 33 between the base plate 1 and the frame exposed section 31 of the frame 3C, the formation length of the frame 3C, that is, a wiring length of the semiconductor device, can be shortened. As a result, it is possible to minimize the inductance of the semiconductor device according to the third embodiment.

In addition, since the screw 4 is supported by the frame bent section 33 provided below the front surface of the head section 42, it is possible to attach the screw 4 to the case 2C by a relatively simple method without using the nut nor integrating the screw 4 and the case 2C in the production process of producing the case 2.

Furthermore, since the frame bent section 33 is connected to the wiring pattern 12 serving as the second circuit pattern by the solder 63 to allow the wiring pattern 12 and the insulation substrate 10 to dissipate heat generated in the frame to the base plate 1, it is possible to make the current density and heat resistance of the semiconductor device according to the third embodiment higher.

For example, the heat generated by the contact resistance between the frame 3C and the external terminal can be released to the base plate 1, the heat generated in the frame 3C can be prevented from being transmitted to the semiconductor elements 5, and the semiconductor device can be put into operation at higher temperatures.

In addition, since the screw 4 of the semiconductor device according to the third embodiment has the above-described head section shape placement feature as in the first embodiment and the second embodiment, it is possible to achieve a high vibration resistance characteristic while further reducing the inductance and reducing the contact resistance between the external terminal and the frame exposed section 31 during screw fixing.

Furthermore, in the semiconductor device according to the third embodiment, as in the first embodiment and the second embodiment, the use of the semiconductor elements 5 each containing, as a major constituent, a compound mainly composed of carbon such as SiC makes it possible to increase a current density of the semiconductor elements 5.

Application to Automobile

Figure 13:
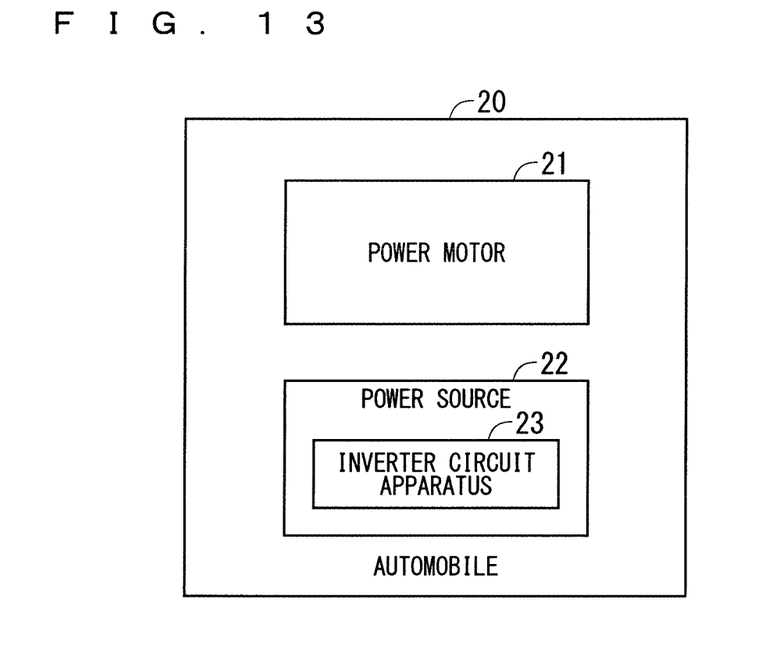
FIG. 13 is an explanatory diagram schematically showing an application example of an automobile using the semiconductor device according to the first to third embodiments.

FIG. 13 is an explanatory diagram schematically showing an application example of an automobile using the semiconductor device according to the first to third embodiments.

As shown in FIG. 13, an automobile 20 primarily includes a power motor 21 and a power source 22 for the power motor 21. Note that, examples of the automobile 20 include not only electric vehicles but also any vehicles such as hybrid vehicles and fuel-cell vehicles that are at least configured to travel by driving the power motor 21.

The power source 22 includes an inverter circuit apparatus 23, and as the inverter circuit apparatus 23, a semiconductor device having a configuration equivalent to any one of the semiconductor devices according to the first to third embodiments is used.

The above-described automobile 20 can reduce loss when the inverter circuit apparatus 23 in the power source 22 that supplies power to the power motor 21 is put into operation at high frequencies. This allows the semiconductor elements 5 to be put into operation at frequencies higher than audible frequencies, and it is thus possible to make the automobile 20 excellent in quietness.

Although the present invention has been described in detail, the above descriptions are illustrative in all aspects, and the present invention is not limited by the descriptions.

It is understood that innumerable modifications not illustrated can be envisaged without departing from the scope of the present invention.

The invention claimed is:

1. A semiconductor device comprising:
a base plate;
an insulation substrate provided on the base plate;
a circuit pattern provided on the insulation substrate;
a semiconductor element provided on the circuit pattern;
a frame provided on the semiconductor element to be electrically connected to the semiconductor element; and
a case provided on the base plate to surround the insulation substrate, the circuit pattern, the semiconductor element, and the frame in a housing area, the case having an insulation property, wherein
the frame includes a frame body section provided in the housing area, and a frame exposed section provided extending from the frame body section to an outside of the housing area and exposed on the case, the frame exposed section including a frame through hole, and
the semiconductor device further comprising a screw provided outside the housing area without placing on the housing area in plan view,
the screw is provided to cause a head section to be covered by the case and cause a threaded section to pass through the frame through hole of the frame exposed section to protrude in a direction away from the base plate.

2. The semiconductor device according to claim 1, wherein
of the screw,
a whole of the head section is placed on the frame exposed section in plan view,
the head section has a rectangular shape in plan view, and sides of the frame exposed section extending in a frame length direction in which the frame exposed section extends from the frame body section serve as short sides, and sides of the frame exposed section extending in a frame width direction orthogonal to the frame length direction serve as long sides.

3. The semiconductor device according to claim 1, wherein
the head section of the screw is embedded in the case with a portion of the case interposed between the head section and the base plate.

4. The semiconductor device according to claim 1, further comprising
a housing area covering section covering the insulation substrate, the circuit pattern, the semiconductor element, and the frame in the housing area, wherein
the head section of the screw is covered by the case with a front surface of the head section exposed, and
the front surface of the head section of the screw is covered by the housing area covering section.

5. A semiconductor device comprising:
a base plate;
an insulation substrate provided on the base plate;
first and second circuit patterns provided on the insulation substrate;
a semiconductor element provided on the first circuit pattern;
a frame provided on the semiconductor element and the second circuit pattern to be electrically connected to the semiconductor element and the second circuit pattern; and a case provided on the base plate to surround the insulation substrate, the first and second circuit patterns, the semiconductor element, and the frame in a housing area, wherein
the frame includes a frame body section provided in the housing area, a frame exposed section provided extending from the frame body section to an outside of the housing area and exposed on the case, and a frame bent section further extending from the frame exposed section and extending, after a distal end portion is bent, in a direction opposite to a direction in which the frame exposed section extends, the frame exposed section including a frame through hole, and the frame bent section being connected to the second circuit pattern, and
a screw is further provided to cause a head section to be covered by the case and cause a threaded section to pass through the frame through hole to protrude in a direction away from the base plate, the screw being supported by the frame bent section from below a front surface of the head section.

6. The semiconductor device according to claim 1, wherein
the semiconductor element contains, as a major constituent, a compound mainly composed of carbon.

7. A production method for the semiconductor device according to claim 4, the production method comprising the steps of:
(a) obtaining a basic structure by integrating the insulation substrate, the circuit pattern, and the semiconductor element on the base plate;
(b) integrating the frame and the case;
(c) temporarily fixing the case and the screw by inserting the threaded section into the frame through hole, fitting the head section into a case opening section provided through the case with a front surface of the head section exposed, and fixing the threaded section with a nut;
(d) fixing the case onto the base plate to cause the case to surround the basic structure and the frame body section of the frame in the housing area;
(e) electrically connecting the semiconductor element and the frame;
(f) forming the housing area covering section where the basic structure and the frame body section in the housing area of the case are covered with an encapsulating material, the housing area covering section further covering the front surface of the head section exposed; and
(g) removing the nut from the threaded section.

8. An automobile comprising:
a power motor; and
a power source for the power motor, wherein
the power source includes an inverter circuit apparatus, and the inverter circuit apparatus includes the semiconductor device according to claim 1.

9. A semiconductor device comprising:
a base plate;
an insulation substrate provided on the base plate;
a circuit pattern provided on the insulation substrate;
a semiconductor element provided on the circuit pattern;
a frame provided on the semiconductor element to be electrically connected to the semiconductor element;
a case provided on the base plate to surround the insulation substrate, the circuit pattern, the semiconductor element, and the frame in a housing area, the case having an insulation property; and a housing area covering section covering the insulation substrate, the circuit pattern, the semiconductor element, and the frame in the housing area, wherein the frame includes a frame body section provided in the housing area, and a frame exposed section provided extending from the frame body section to an outside of the housing area and exposed on the case, the frame exposed section including a frame through hole, the semiconductor device further comprising a screw provided to cause a head section to be covered by the case and cause a threaded section to pass through the frame through hole of the frame exposed section to protrude in a direction away from the base plate, the head section of the screw is covered by the case with a front surface of the head section exposed, and the front surface of the head section of the screw is covered by the housing area covering section.

10. A production method for the semiconductor device according to claim 9, the production method comprising the steps of:

(a) obtaining a basic structure by integrating the insulation substrate, the circuit pattern, and the semiconductor element on the base plate;

(b) integrating the frame and the case;

(c) temporarily fixing the case and the screw by inserting the threaded section into the frame through hole, fitting the head section into a case opening section provided through the case with a front surface of the head section exposed, and fixing the threaded section with a nut;

(d) fixing the case onto the base plate to cause the case to surround the basic structure and the frame body section of the frame in the housing area;

(e) electrically connecting the semiconductor element and the frame;

(f) forming the housing area covering section where the basic structure and the frame body section in the housing area of the case are covered with an encapsulating material, the housing area covering section further covering the front surface of the head section exposed; and (g) removing the nut from the threaded section.

\* \* \* \* \*